United States Patent
Wu

(10) Patent No.: US 7,793,195 B1
(45) Date of Patent: Sep. 7, 2010

(54) INCREMENTAL GENERATION OF POLYNOMIALS FOR DECODING REED-SOLOMON CODES

(75) Inventor: Yingquan Wu, Santa Clara, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 1106 days.

(21) Appl. No.: 11/433,645

(22) Filed: May 11, 2006

(51) Int. Cl.
 *H03M 13/00* (2006.01)
(52) U.S. Cl. .................................. 714/781; 714/784
(58) Field of Classification Search ............. 714/781, 714/784
 See application file for complete search history.

(56) References Cited

U.S. PATENT DOCUMENTS

| | | | | |
|---|---|---|---|---|
| 4,397,022 A | * | 8/1983 | Weng et al. | 714/783 |
| 5,715,258 A | * | 2/1998 | Ikeda et al. | 714/759 |
| 6,092,233 A | * | 7/2000 | Yang | 714/784 |
| 6,134,694 A | * | 10/2000 | Uebayashi et al. | 714/751 |
| 6,360,348 B1 | * | 3/2002 | Yang | 714/784 |
| 6,460,160 B1 | * | 10/2002 | Classon | 714/791 |
| 6,487,691 B1 | * | 11/2002 | Katayama et al. | 714/784 |
| 6,516,443 B1 | * | 2/2003 | Zook | 714/792 |
| 6,888,897 B1 | | 5/2005 | Nazari et al. | |
| 6,917,313 B1 | | 7/2005 | Burd et al. | |
| 6,931,585 B1 | | 8/2005 | Burd et al. | |
| 6,961,197 B1 | | 11/2005 | Burd et al. | |
| 7,310,767 B2 | * | 12/2007 | Desai et al. | 714/782 |
| 2003/0093741 A1 | * | 5/2003 | Argon et al. | 714/755 |
| 2003/0232601 A1 | * | 12/2003 | Uno | 455/67.11 |
| 2004/0019842 A1 | * | 1/2004 | Argon et al. | 714/755 |
| 2006/0059410 A1 | * | 3/2006 | Santraine et al. | 714/785 |

OTHER PUBLICATIONS

V. Guruswami and M. Sudan, "Improved decoding of Reed-Solomon codes and algebraic-geometry codes," IEEE Trans. Inform. Theory, vol. 45, No. 6, pp. 1757-1767, Sep. 1999.
R. Koetter and A. Vardy, "Algebraic soft-decision decoding of Reed-Solomon codes," IEEE Trans. Inform. Theory, vol. 49, No. 11, pp. 2809-2825, Nov. 2003.
J. Jiang and K. R. Narayanan, "Iterative soft-input-soft-output decoding of Reed-Solomon codes by adapting the parity check matrix," IEEE Trans. Inform. Theory, vol. 52, pp. 3746-3756, Aug. 2006.
G. D. Forney, "Generalized minimum distance decoding," IEEE Trans. Inform. Theory, vol. 12, pp. 125-131, Dec. 1966.
David Chase. "A Class of Algorithms for Decoding Block Codes With Channel Measurement Information." IEEE Transactions on Information Theory. Jan. 1972. pp. 170-182. vol. IT-18, No. 1.
G. David Forney, Jr. "On Decoding BCH Codes." IEEE Transactions on Information Theory. Oct. 1965. pp. 549-557. vol. IT-11, No. 4.
Ralf Kotter. "Fast Generalized Minimum-Distance Decoding of Algebraic-Geometry and Reed-Solomon Codes." IEEE Transactions on Information Theory, May 1996. pp. 721-737. vol. 42, No. 3.
James L. Massey. "Shift-Register Synthesis and BCH Decoding." IEEE Transactions on Information Theory. Jan. 1969. pp. 122-127. vol. IT-15, No. 1.
Elwyn Berlekamp. "Bounded Distance + 1 Soft-Decision Reed-Solomon Decoding." IEEE Transactions on Information Theory. May 1996. pp. 704-720. vol. 42, No. 3.

* cited by examiner

*Primary Examiner*—M. Mujtaba K Chaudry
(74) *Attorney, Agent, or Firm*—Van Pelt, Yi & James LLP

(57) ABSTRACT

Generating a polynomial is disclosed. A prior error locator polynomial, associated with locating errors in encoded data, is obtained. A new error locator polynomial, associated with a test error pattern, is incrementally generated based at least in part on the prior error locator polynomial.

24 Claims, 5 Drawing Sheets

US 7,793,195 B1

INCREMENTAL GENERATION OF POLYNOMIALS FOR DECODING REED-SOLOMON CODES

BACKGROUND OF THE INVENTION

Chase decoding is a soft-decision decoding technique for algebraic codes where an efficient bounded-distance decoder is available. The straightforward approach to perform Chase decoding is to repeatedly flip test error patterns and perform a full Berlekamp-Massey process for each test error pattern. From a computational point of view, this has a complexity of O(nd), where n denotes the code length and d denotes the minimum Hamming distance. In hardware implementations (e.g., implemented as an Application Specific Integrated Circuit (ASIC) or Field Programmable Gate Array (FPGA)) and software implementations (e.g., a computer program) performing Chase decoding in a straightforward manner requires increasing amounts of time as the code length and/or the minimum Hamming distance increase. Techniques to perform Chase decoding in less time would be useful.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A Chase decoder that generates a new error locator polynomial using interpolation and linear feedback shift register techniques is disclosed. In some embodiments, after performing a full Berlekamp-Massey process once, a new error locator polynomial is obtained by flipping a test error pattern and employing an interpolation-based linear feedback shift register, rather than repeatedly going through the full Berlekamp-Massey process which takes d−1 iterations, where d denotes the minimum Hamming distance. In some embodiments, there are multiple interpolation-based linear feedback shift registers operating in parallel. From a computational point of view, this requires complexity O(n) in attempting to determine a codeword, compared to O(nd) when straightforwardly utilizing the Berlekamp-Massey process, where n denotes the code length and d denotes the minimum Hamming distance.

Although the embodiments described herein discuss a Chase decoder to process Reed-Solomon codes, the techniques described may be modified as appropriate for other codes. In some embodiments, other codes such as Bose, Ray-Chaudhuri, Hocquenghem (BCH) codes and generalized Reed-Solomon codes are processed.

Figure 1:
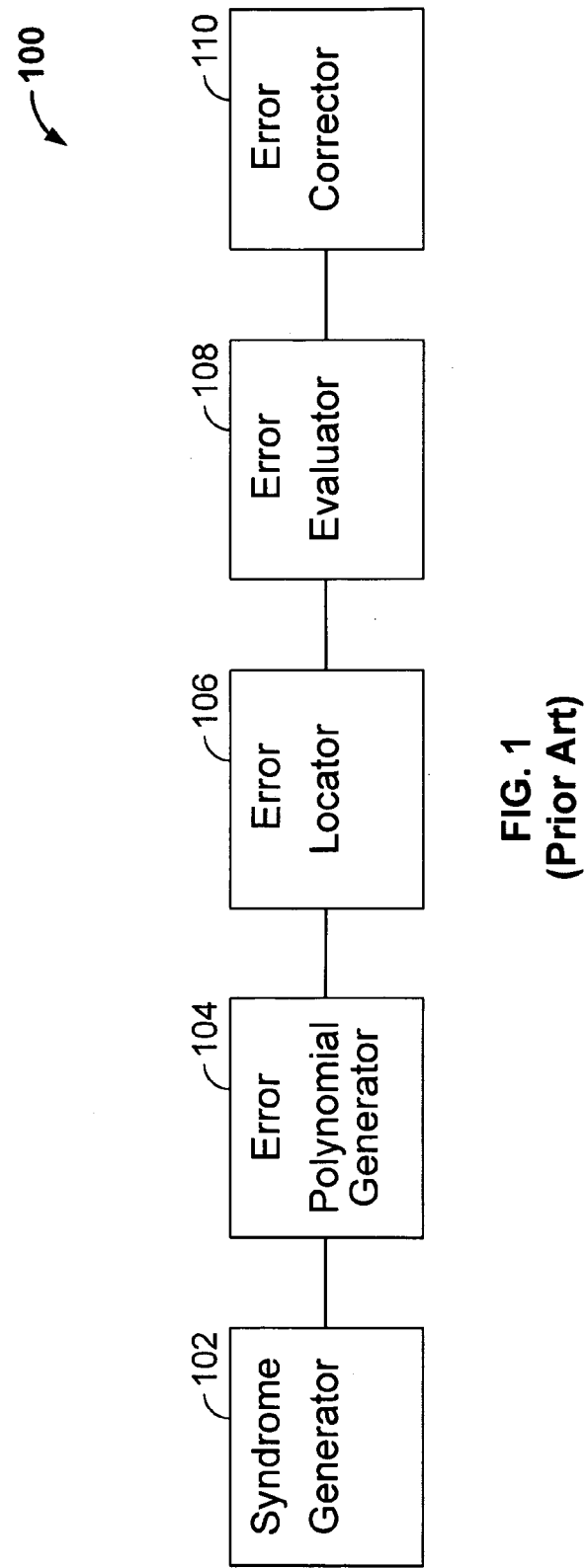
FIG. 1 is a diagram illustrating an embodiment of a Reed-Solomon decoder.

FIG. 1 is a diagram illustrating an embodiment of a Reed-Solomon decoder. In the example shown, for a Reed-Solomon C(n, k) code over a Galois Field of GF(q), a k-symbol data word $D \triangleq [D_{k-1}, D_{k-2}, \ldots, D_1, D_0]$ is encoded to produce an n-symbol codeword $C \triangleq [C_{n-1}, C_{n-2}, \ldots, C_1, C_0]$. Another way of expressing this is that a data word polynomial $D(x) = D_{k-1}x^{k-1} + D_{k-2}x^{k-2} + \ldots + D_1 x^1 + D_0$ is encoded to produce a codeword polynomial $C(x) = C_{n-1}x^{n-1} + C_{n-2}x^{n-2} + \ldots + C_1 x + C_0$, by means of a generator polynomial $$G(x) \triangleq \prod_{i=0}^{n-k-1} (x - \alpha^{m_0+i}),$$

where $m_0$ is typically 0 or 1 and $\alpha$ is a primitive element of GF(q). As used herein, vector $A = [A_0, A_1, A_2, \ldots, A_l]$ and its polynomial representation $A(x) = A_0 + A_1 x + A_2 x^2 + \ldots A_l x^l$ may be used interchangeably. In some embodiments, a polynomial of degree less than n is a codeword polynomial if and only if it is a multiple of the generator polynomial, G(x). A codeword polynomial C(x) satisfies $$C(\alpha^{m_0+i}) = 0, i = 0, 1, 2, \ldots, n-k-1.$$

The minimum Hamming distance of the code is $d_{min} = n - k + 1$, a feature known as maximally-distance-separable. For purposes of illustration, the examples described herein consider the specific case where $q = 2^m$ (i.e., $GF(2^m)$), instead of the general case where $GF(p^m)$, and $m_0 = 1$. In other words, the code illustrated in this embodiment is defined such that n−k=2t (where t is the error-correction capability). Although examples described herein consider the above specific case, in some embodiments, other cases may be used.

A systematic encoding generates a codeword that is comprised of the data word and parity-check symbols. To generate a codeword, let $\Psi(x) \triangleq \Psi_{2t-1} x^{2t-1} + \Psi_{2t-2} x^{2t-2} + \ldots + \Psi_1 x + \Psi_0$ denote the remainder when $x^{2t} D(x)$ is divided by G(x). The polynomial $x^{2t} D(x) - \Psi(x)$ is then a multiple of G(x) and is denoted as a systematic codeword polynomial; alternatively, $C = [D_{k-1}, D_{k-2}, \ldots, D_0, -\Psi_{2t-1}, -\Psi_{2t-2}, \ldots, -\Psi_0]$.

Let $C(x)$ denote the transmitted codeword polynomial and $R(x)$ the received word polynomial after appropriate channel quantization. The received word polynomial, $R(x)$, is passed to decoder 100 and may include some errors. The decoding objective is to determine the error polynomial $E(x)$ such that $C(x)=R(x)-E(x)$. That is, decoder 100 attempts to produce the original codeword, $C(x)$, using the received polynomial, $R(x)$.

Syndrome generator 102 generates syndrome values using the received polynomial, $R(x)$. Syndrome values are computed using:

$$S_i=R(\alpha^{i+1})=C(\alpha^{i+1})+E(\alpha^{i+1})=E(\alpha^{i+1}), i=0,1,2,\ldots, 2t-1.$$

If all 2t syndrome values are zero, then $R(x)$ is a codeword and it may be assumed that $C(x)=R(x)$, i.e., no errors have occurred. Otherwise, the decoder attempts to solve the following equation system:

$$\begin{cases} Y_1 X_1^1 + Y_2 X_2^1 + \ldots + Y_e X_e^1 = S_0 \\ Y_1 X_1^2 + Y_2 X_2^2 + \ldots + Y_e X_e^2 = S_1 \\ \vdots \\ Y_1 X_1^{2t} + Y_2 X_2^{2t} + \ldots + Y_e X_e^{2t} = S_{2t-1} \end{cases}$$

where $e$ denotes the (unknown) number of errors, $X_1, X_2, \ldots, X_e$ denote the error locations, and $Y_1, Y_2, \ldots, Y_e$ denote the corresponding error magnitudes.

The syndrome polynomial generated by syndrome generator 102 is defined to be:

$$S(x) \triangleq S_0+S_1 x+S_2 x^2+\ldots+S_{2t-1}x^{2t-1}. \quad (1)$$

The syndromes (i.e., the coefficients of the syndrome polynomial) are passed from syndrome generator 102 to error polynomial generator 104. Error polynomial generator 104 generates the error locator polynomial, $\Lambda(x)$, which is defined to be:

$$\Lambda(x) \triangleq \prod_{i=1}^{e}(1-X_i x) = 1+\Lambda_1 x+\Lambda_2 x^2+\ldots+\Lambda_e x^e. \quad (2)$$

Additional polynomials besides the error locator polynomial may be generated by error polynomial generator 104.

The error evaluator polynomial is defined to be:

$$\Omega(x) \triangleq \sum_{i=1}^{e} Y_i X_i \prod_{j=1, j\neq i}^{e}(1-X_j x) = \Omega_0+\Omega_1 x+\Omega_2 x^2+\ldots+\Omega_{e-1}x^{e-1}. \quad (3)$$

The three polynomials satisfy the following equation:

$$\Omega(x)=\Lambda(x)S(x) \pmod{x^{2t}}. \quad (4)$$

The Berlekamp-Massey method can be used to solve equation 4, given that the number of errors e does not exceed the error-correction capability t. The essence of the Berlekamp-Massey method is to determine a minimum-length linear feedback shift register (LFSR) that generates the syndrome sequence $S_0, S_1, S_2, \ldots, S_{2t-1}$, where an LFSR of length L, $a_0, a_1, a_2, \ldots, a_L$, generates the sequence $S_0, S_1, S_2, \ldots, S_{2t-1}$ if $$\sum_{j=0}^{L} S_{i-j} a_j = 0, \quad i=L, L+1, \ldots, 2t-1. \quad (5)$$

More specifically, the Berlekamp-Massey method produces two polynomials, $\Lambda(x)$ and $B(x)$ as characterized by the following lemma.

Lemma 1 (i). $\Lambda(x)$ is a minimum-length LFSR that generates the sequence $S_0, S_1, S_2, \ldots, S_{2t-1}$. $B(x)$ is a minimum-length LFSR that generates the sequence $S_0, S_1, S_2, \ldots, S_{2t-2}$ but not $S_0, S_1, S_2, \ldots, S_{2t-1}$.

(ii). The degrees of $\Lambda(x)$ and $B(x)$, denoted by $L_\Lambda$ and $L_B$ respectively, satisfy $$L_\Lambda+L_B=2t. \quad (6)$$

(iii). The polynomials $\Lambda(x)$ and $B(x)$ are relatively prime, i.e., the two do not share a common factor.

It is worth mentioning that there may exist multiple minimum-length LFSRs that generate the sequence $S_0, S_1, S_2, \ldots, S_{2t-1}$, and $\Lambda(x)$ obtained from the Berlekamp-Massy process is one of them when non-unique. Note also that "a polynomial a(x) generating the sequence $S_0, S_1, S_2, \ldots, S_{2t-1}$" is equivalent to "the degree of the polynomial $a(x)S(x) \pmod{x^{2t}}$ less than that of $a(x)$."

Note in this presentation an error locator polynomial does not have to be normalized. For notational convenience, the following is defined $$\Theta(x) \triangleq B(x)S(x) \pmod{x^{2t-1}}. \quad (7)$$

Note that the above definition differs slightly from that of $\Omega(x)$ which takes mod $x^{2t}$, due to the fact that $\Lambda(x)$ generates $S_0, S_1, S_2, \ldots, S_{2t-1}$; whereas $B(x)$ generates only $S_0, S_1, S_2, \ldots, S_{2t-2}$.

The error locator polynomial, $\Lambda(x)$, is passed from error polynomial generator 104 to error locator 106. Error locations may correspond to the roots, $X_i$, of the error locator polynomial, $\Lambda(x)$. Error locator 106 may use a Chien search method to determine error locations.

Error evaluator 108 determines the error magnitudes, $Y_i$. Error locations are received from error locator 106 and are used to determine the error magnitudes. Some Reed Solomon decoders use the Forney formula to determine the error magnitudes. Other error magnitude formulas besides the Forney formula may be determined and used to generate the error magnitudes. For example, error magnitudes formulas that allow reduced hardware or reduced clock cycles may be preferred. In some embodiments, the error magnitude formula may allow improvements in other blocks besides the error evaluator. For example, using some error magnitude formulas, error polynomial generator 104 or error locator 106 may also be improved.

Error corrector 110 uses the error magnitudes and error locations to correct the received polynomial, $R(x)$. If the error correction capability of the code is able to correct for the received errors, $E(x)$, then the output of error corrector 110 is $C(x)$, the codeword originally transmitted.

Decoder 100 can be used in a variety of applications. In some embodiments, decoder 100 is used in a storage system, such as a disk drive system. Data written to a storage medium is encoded (e.g., using a Reed-Solomon code) and the stored data is decoded (e.g., using the incremental polynomial generation technique described herein) when read back. Other applications of decoder 100, and thus the incremental polynomial generation technique, include compact disk players, digital televisions, wireless communication (e.g., satellites), and wired communication (e.g., Asymmetric Digital Subscriber Line (ADSL) modems).

Figure 2:
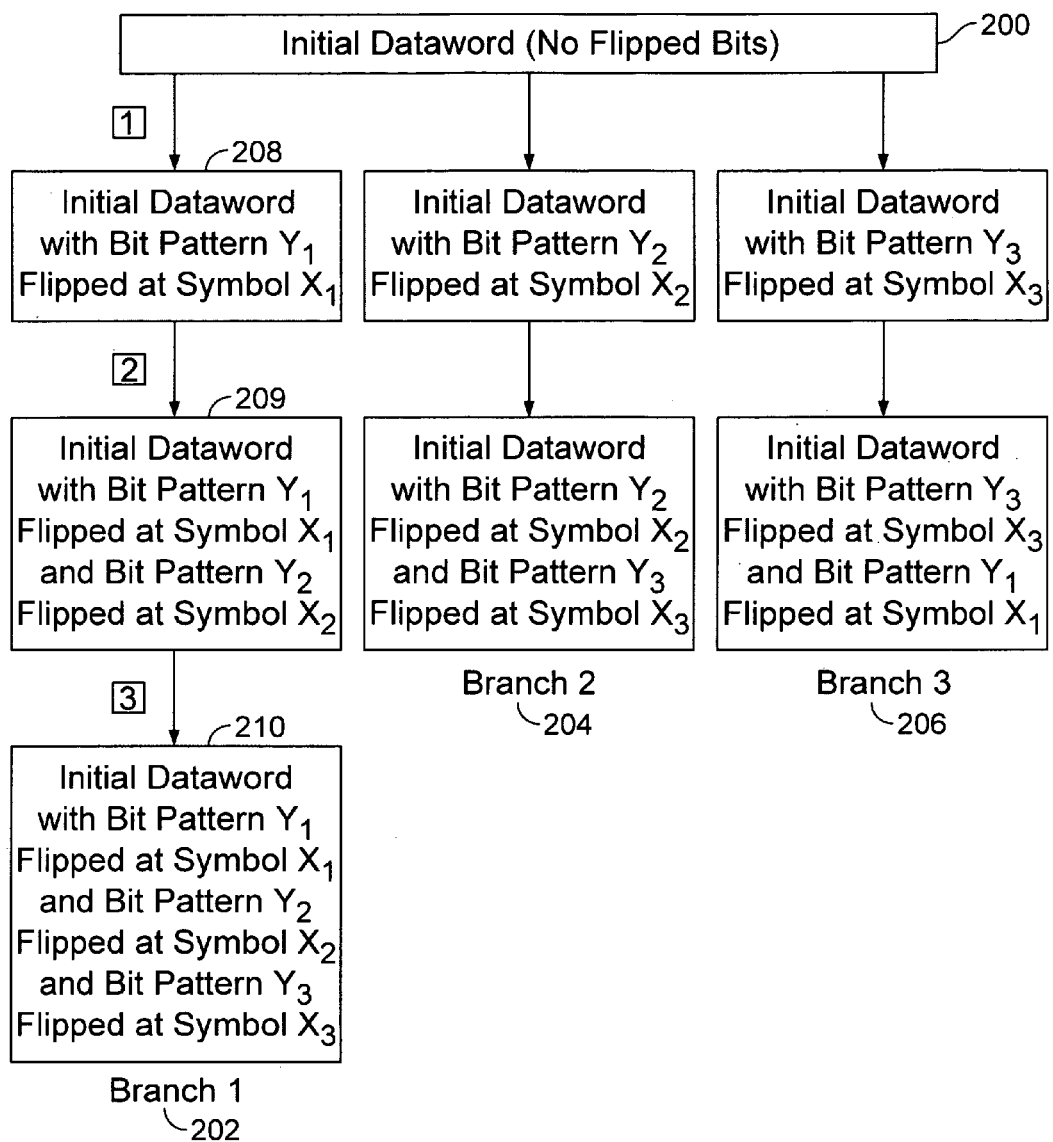
FIG. 2 is a diagram illustrating an embodiment of test error patterns associated with a Chase decoding process.

FIG. 2 is a diagram illustrating an embodiment of test error patterns associated with a Chase decoding process. In the example shown, $\tau=3$, where $\tau$ is the number of symbols identified to have an error by a soft output Viterbi decoder. In a straightforward Chase decoding process, all combinations of a set of $\tau(\tau \leq t)$ symbol error patterns are flipped, each time applying bounded-distance decoding to that particular combination of flipped/non-flipped symbol error patterns. The most likely codeword, if any, is selected from the decoded candidate codewords.

In this section, an incremental generation technique is described to determine valid error locator polynomials. In some embodiments, the incremental generation technique is performed in one-pass. By one-pass, it is meant that one iteration can be performed in a constant number of steps or amount of time, independent of code length, n, as well as the error-correction capability, t, when the process is performed in parallel.

The diagram shown illustrates one embodiment of a flipping sequence. In discussing how to incrementally generate error locator polynomials, processing with respect to one branch is described and it is to be understood that the operations performed in one branch are repeated for other branches. To obtain test error pattern 208, an initial dataword 200 is flipped at bit pattern $Y_1$ at symbol $X_1$. To obtain test error pattern 209 from test error pattern 208, bit pattern $Y_2$ at symbol $X_2$ is flipped.

Error locator polynomials in this example are first incrementally generated for the first branch (202), where incrementally generating includes generating based on a prior version or iteration of that polynomial. For example, an error locator polynomial is generated for test error pattern 208 based on the error locator polynomial associated with initial dataword 200. The error locator polynomial for test error pattern 209 is based on that for 208 and similarly the error locator polynomial for test error pattern 210 is based on that for 209. The process is repeated for the second branch (204) and the third branch (206). At the start of each branch the process is reinitialized using data associated with initial dataword 200.

A tree structure (identical or similar to that shown in this figure) may be a memory efficient way of incrementally generating error locator polynomials. By using a tree structure, it may not be necessary to store all error locator polynomials generated as the tree is traversed. In some embodiments, only the best (or one of the best) error locator polynomials generated is used in subsequent processing, such as a Chien search to find the error locations using the best error locator polynomial, error correction, etc. Thus, it may be sufficient to store the current best error locator polynomial (to be used subsequently) and the immediately prior error locator polynomial (used to incrementally generate the current error locator polynomial). In some embodiments, a different sequence of test patterns (and correspondingly a difference sequence of generating error locator polynomials) is used compared to that illustrated. For example, it is not necessary to use a tree structure or a different tree structure is used.

Let $(X_1, Y_1), (X_2, Y_2), \ldots, (X_\tau, Y_\tau)$, where $X_i$ indicates the symbol location and $Y_i$ indicates the corresponding bit pattern associated with that symbol location, be the sequence to be sequentially flipped. Cumulative sets $\sigma_i$, $i=0, 1, 2, \ldots, \tau$, are defined such that $$\sigma_i = \{(X_1, Y_1), (X_2, Y_2), \ldots, (X_i, Y_i)\}. \tag{8}$$

For example, the first branch (202) of test error patterns can be generated by sequentially flipping as described. The second and third branches (204 and 206) are generated slightly differently. Let $S_j^{(\sigma_i)}$, $j=0, 1, 2, \ldots, 2t-1$, be the variant syndrome associated with flipping pattern set $\sigma_i$.

$$S_j^{(\sigma_i)} = S_j + \sum_{l=1}^{i} Y_l X_l^{j+1} = S_j^{(\sigma_{i-1})} + Y_i X_i^{j+1}. \tag{9}$$

Let $\Lambda^{(\sigma_0)}(x)$ and $B^{(\sigma_0)}(x)$ denote the polynomials $\Lambda(x)$ and $B(x)$, respectively, obtained from the Berlekamp-Massey process using an initial syndrome.

Some optimization problems associated with incrementally generating error locator polynomials for the test error patterns are presented below. Discussion of the optimization problems follows.

$A[\sigma_i]$: Determine a minimum-length LFSR $\Lambda^{(\sigma_i)}(x)$, subject to (i) $\Lambda_0^{(\sigma_i)} \neq 0$ and $\Lambda^{(\sigma_i)}(x)$ generates the sequence $S_0, S_1, S_2, \ldots, S_{2t-1}$; (ii) $\Lambda^{(\sigma_i)}(x)$ contains roots $X_1^{-1}, X_2^{-1}, \ldots, X_i^{-1}$; and (iii) $\hat{\Omega}^{(\sigma_i)}(x) \triangleq S^{(\sigma_i)}(x) \Lambda^{(\sigma_i)}(x) \pmod{x^{2t}}$ contains roots $X_1^{-1}, X_2^{-1}, \ldots, X_i^{-1}$.

$B[\sigma_i]$: Determine a minimum-length LFSR $B^{(\sigma_i)}(x)$, subject to (i) $B^{(\sigma_i)}(x)$ generates the sequence $S_0, S_1, S_2, \ldots, S_{2t-2}$ but not $S_0, S_1, S_2, \ldots, S_{2t-1}$; (ii) $B^{(\sigma_i)}(x)$ contains roots $X_1^{-1}, X_2^{-1}, \ldots, X_i^{-1}$; and (iii) $\hat{\Theta}^{(\sigma_i)}(x) \triangleq S^{(\sigma_i)}(x) B^{(\sigma_i)}(x) \pmod{x^{2t}}$ contains roots $X_1^{-1}, X_2^{-1}, \ldots, X_i^{-1}$.

Note that $\hat{\Omega}$ and $\hat{\Theta}$ are variants of $\Omega$ and $\Theta$, respectively. The second criterion, (ii), for $A[\sigma_i]$ and $B[\sigma_i]$ suggest cumulative or incremental interpolation and is discussed in further detail below. The following lemma discusses some properties associated with cumulative interpolation.

Lemma 2 Let $\Lambda^{(\sigma_i)}(x)$ and $B^{(\sigma_i)}(x)$ ($i<t$) be a solution of the optimization problems $A[\sigma_i]$ and $B[\sigma_i]$, respectively.

(i). Let $\Lambda^{(\sigma_{i+1})}(x)$ be a minimum-length LFSR in the form of $$\Lambda^{(\sigma_{i+1})}(x) = (1+xa(x)) \cdot \Lambda^{(\sigma_i)}(x) + b(x) \cdot xB^{(\sigma_i)}(x) \tag{10}$$

with the polynomials $a(x)$ and $b(x)$ selected so that both $\Lambda^{(\sigma_{i+1})}(x)$ and $\hat{\Omega}^{(\sigma_{i+1})}(x)$ contain the root $X_{i+1}^{-1}$. Then, $\Lambda^{(\sigma_{i+1})}(x)$ is a solution of the optimization problem $A[\sigma_{i+1}]$.

(ii). Let $B^{(\sigma_{i+1})}(x)$ be a minimum-length LFSR in the form of $$B^{(\sigma_{i+1})}(x) = a'(x) \cdot \Lambda^{(\sigma_i)}(x) + (1+xb'(x)) B^{(\sigma_i)}(x) \tag{11}$$

with the polynomials $a'(x)$ and $b'(x)$ selected so that both $B^{(\sigma_{i+1})}(x)$ and $\hat{\Theta}^{(\sigma_{i+1})}(x)$ contain the root $X_{i+1}^{-1}$. Then, $B^{(\sigma_{i+1})}(x)$ is a solution of the optimization problem $B[\sigma_{i+1}]$.

Proof of (i) for Lemma 2. $\Lambda^{(\sigma_{i+1})}(x)$ satisfies criterion (ii) of $A[\sigma_{i+1}]$. The conclusion that $\Lambda^{(\sigma_{i+1})}(x)$ generates $S_0, S_1, S_2, \ldots, S_{2t-1}$ results from the fact that both $\Lambda^{(\sigma_i)}(x)$ and $xB^{(\sigma_i)}(x)$ generate $S_0, S_1, S_2, \ldots, S_{2t-1}$ (i.e., criterion (i) of $A[\sigma_{i+1}]$ is satisfied). Criterion (iii) of $A[\sigma_{i+1}]$ is demonstrated. It is noted that $$\hat{\Omega}^{(\sigma_{i+1})}(x) = S^{(\sigma_{i+1})}(x) \Lambda^{(\sigma_{i+1})}(x) \pmod{x^{2t}}$$
$$= \left( S^{(\sigma_i)}(x) + Y_{i+1} X_{i+1} \sum_{j=0}^{2t-1} X_{i+1}^j x^j \right) \Lambda^{(\sigma_{i+1})}(x) \pmod{x^{2t}}$$
$$= S^{(\sigma_i)}(x)(1+xa(x)) \cdot \Lambda^{(\sigma_i)}(x) + b(x) \cdot xB^{(\sigma_i)}(x)) \pmod{x^{2t}} +$$

-continued $$Y_{i+1}X_{i+1}\frac{1-X_{i+1}^{2t}x^{2t}}{1-X_{i+1}x}\Lambda^{(\sigma_{i+1})}(x)(\text{mod }x^{2t})$$

$$=(1+xa(x))\cdot\hat{\Omega}^{(\sigma_i)}(x)+b(x)\cdot x\hat{\Theta}^{(\sigma_i)}(x)+Y_{i+1}X_{i+1}\frac{\Lambda^{(\sigma_{i+1})}(x)}{1-X_{i+1}x}$$

where in the last equality, the first two terms are due to criterion (i) of $A[\sigma_i]$ for $\Lambda^{(\sigma_i)}(x)$ and criterion (i) of $B[\sigma_i]$ for $B^{(\sigma_i)}(x)$, so that the degrees of $\hat{\Omega}^{(\sigma_i)}(x)$ and $\hat{\Theta}^{(\sigma_i)}(x)$ are less than that of $\Lambda^{(\sigma_i)}(x)$ and $B^{(\sigma_i)}(x)$, respectively. The last term is due to the assumption that $1-X_{i+1}x$ is divisible by $\Lambda^{(\sigma_{i+1})}(x)$. Thus, $\Lambda^{(\sigma_{i+1})}(x)$ also contains the roots $X_1^{-1}, X_2^{-1}, \ldots, X_i^{-1}$ (i.e., it satisfies criterion (iii) of $A[\sigma_{i+1}]$).

The conclusion that $B^{(\sigma_{i+1})}(x)$ generates $S_0, S_1, S_2, \ldots, S_{2t-2}$ but not $S_0, S_1, S_2, \ldots, S_{2t-1}$ results from the fact that $B^{(\sigma_i)}(x)$, a component of $B^{(\sigma_{i+1})}(x)$, generates only $S_0, S_1, S_2, \ldots, S_{2t-2}$. Proof of the remainder of Lemma 2 follows that of part (i).

The following lemma in turn discusses the properness of the proposed problem formulation.

Lemma 3 If $(X_1, Y_1), (X_2, Y_2), \ldots, (X_i, Y_i)$ ($i \le t$) are true error patterns out of t+i symbol errors, then the true error locator polynomial is the unique solution (upon normalization) of the proposed optimization problem, $A[\sigma_i]$.

Proof: Let $\tilde{X}_1, \tilde{X}_2, \ldots, \tilde{X}_t$ be associated with the remaining erroneous locations in addition to $X_1, X_2, \ldots, X_i$. Then the error locator polynomial can be expressed as $$\Lambda^*(x)=\prod_{j=1}^{i}(1-X_jx)\prod_{j=1}^{t}(1-\tilde{X}_jx).$$

The genuine error locator polynomial $\Lambda^*(x)$ satisfies the criteria (i) and (ii) of $A[\sigma_i]$. It is observed that $$\hat{\Omega}^*(x)=\Lambda^*(x)S^{(\sigma_i)}(x)(\text{mod }x^{2t})$$

$$=\prod_{j=1}^{i}(1-X_jx)\left(\prod_{j=1}^{t}(1-\tilde{X}_jx)S^{(\sigma_i)}(x)\ (\text{mod }x^{2t})\right)$$

Note in the last equality, the second term is of degree t−1. Therefore $\hat{\Omega}^*(x)$ contains the roots $X_1^{-1}, X_2^{-1}, \ldots, X_i^{-1}$ (i.e., $\Lambda^*(x)$ also satisfies criterion (iii) of $A[\sigma_i]$).

It is next shown by contradiction that $\Lambda^*(x)$ is the unique solution of the optimization problem $A[\sigma_i]$. Otherwise, let the polynomial $\Lambda^{(\sigma_i)}(x)$ be a solution of the optimization problem $A[\sigma_i]$. By assumption, $\Lambda^{(\sigma_i)}(x)$ has a length less than or equal to t+i and $\Lambda^{(\sigma_i)}(x) \ne \Lambda^*(x)$. According to criterion (i) of $A[\sigma_i]$, $\Omega(x)=\Lambda^{(\sigma_i)}(x)S(x)$ (mod $x^{2t}$) has a degree less than t+i. It is observed that $$\Omega(x)=\Lambda^{(\sigma_i)}(x)S(x)\ (\text{mod }x^{2t})\qquad(12)$$

$$=\Lambda^{(\sigma_i)}(x)\left(S^{(\sigma_i)}(x)+\sum_{l=1}^{i}\sum_{j=0}^{2t-1}Y_lX_l^{j+1}x^j\right)(\text{mod }x^{2t})$$

$$=(\Lambda^{(\sigma_i)}(x)S^{(\sigma_i)}(x)\ (\text{mod }x^{2t}))+\left(\Lambda^{(\sigma_i)}(x)\sum_{l=1}^{i}Y_lX_l\frac{1-X_l^{2t}x^{2t}}{1-X_lx}(\text{mod }x^{2t})\right)$$

$$=\hat{\Omega}^{(\sigma_i)}(x)+\sum_{l=1}^{i}Y_lX_l\frac{\Lambda^{(\sigma_i)}(x)}{1-X_lx}.\qquad(13)$$

In the last equality, the second term has a degree less than that of $\Lambda^{(\sigma_i)}(x)$. Thus, the degree of the first term of $\hat{\Omega}(x)$ can not exceed that of $\Lambda^{(\sigma_i)}(x)$.

A new polynomial $$\tilde{\Lambda}^{(\sigma_i)}(x)\triangleq\frac{\Lambda^{(\sigma_i)}(x)}{\prod_{l=1}^{i}(1-X_lx)}$$

is defined. By the definition of $\hat{\Omega}^{(\sigma_i)}(x)$ $$\Lambda^{(\sigma_i)}(x)S^{(\sigma_i)}(x)=\hat{\Omega}^{(\sigma_i)}(x)+x^{2t}f(x).$$

where $f(x)$ is a polynomial. Since both $\Lambda^{(\sigma_i)}(x)$ and $\hat{\Omega}^{(\sigma_i)}(x)$ divide the term $\prod_{j=1}^{i}(1-X_jx)$, $f(x)$ divides $\prod_{j=1}^{i}(1-X_jx)$ as well. Thus, $$\tilde{\Lambda}^{(\sigma_i)}(x)S^{(\sigma_i)}(x)=\frac{\hat{\Omega}^{(\sigma_i)}(x)}{\prod_{j=1}^{i}(1-X_jx)}+x^{2t}\frac{f(x)}{\prod_{j=1}^{i}(1-X_jx)}.$$

Equivalently, $$\frac{\hat{\Omega}^{(\sigma_i)}(x)}{\prod_{j=1}^{i}(1-X_jx)}=\tilde{\Lambda}^{(\sigma_i)}(x)S^{(\sigma_i)}(x)\ (\text{mod }x^{2t}).$$

The above equality, in conjunction with the fact that the degree of $\hat{\Omega}^{(\sigma_i)}(x)$ is less than that of $\Lambda^{(\sigma_i)}(x)$, indicates that $\tilde{\Lambda}^{(\sigma_i)}(x)$ generates the sequence $S_0^{(\sigma_i)}, S_1^{(\sigma_i)}, \ldots, S_{2t-1}^{(\sigma_i)}$. On the other hand, the polynomial $\tilde{\Lambda}^{(\sigma_i)}(x)$ has a degree of at most t; this contradicts with the fact there is unique minimum degree polynomial that generates $S_0^{(\sigma_i)}, S_1^{(\sigma_i)}, \ldots, S_{2t-1}^{(\sigma_i)}$, namely, $\Pi_{j=1}^{t}(1-\tilde{X}_j x)$. This concludes the lemma.

The computation can be simplified $$\hat{\Omega}^{(\sigma_{i+1})}(x) = (1+xa(x))\Lambda^{(\sigma_i)}(x)S^{(\sigma_{i+1})}(x) + b(x) \cdot xB^{(\sigma_i)}(x)S^{(\sigma_{i+1})}(x) \pmod{x^{2t}} \quad (14)$$

where a(x) and b(x) are unknown polynomials with the underlying condition that $\Lambda^{(\sigma_{i+1})}(x) = (1+xa(x)) \cdot \Lambda^{(\sigma_i)}(x) + b(x) \cdot xB^{(\sigma_i)}(x)$ has a degree less than 2t and contains the roots $X_{i+1}^{-1}$. Note that neither $\Lambda^{(\sigma_i)}(x)$ nor $B^{(\sigma_i)}(x)$ generates $S^{(\sigma_{i+1})}(x)$. Thus, the following inequality holds $$\hat{\Omega}^{(\sigma_{i+1})}(x) \neq (1+xa(x))(\Lambda^{(\sigma_i)}(x)S^{(\sigma_{i+1})}(x) \bmod x^{2t}) + b(x)(xB^{(\sigma_i)}(x)S^{(\sigma_{i+1})}(x) \bmod x^{2t})$$

It has been shown in equation 13 that $\Lambda^{(\sigma_{i+1})}(x)$ generates $S^{(\sigma_{i+1})}(x)$. Thus, all terms with degrees higher than that of $\Lambda^{(\sigma_{i+1})}(x)$ can be safely ignored. To this end, the following is defined $$[x^l \overline{\Omega}^{(\sigma_i)}](x) \triangleq x^l \Lambda^{(\sigma_i)}(x) S^{(\sigma_{i+1})}(x) \pmod{x^{2t-1}}. \quad (15)$$

$$[x^l \overline{\Theta}^{(\sigma_i)}](x) \triangleq x^l B^{(\sigma_i)}(x) S^{(\sigma_{i+1})}(x) \pmod{x^{2t-1}}. \quad (16)$$

Consequently, $$[x^l \overline{\Omega}^{(\sigma_i)}](x) = \quad (17)$$

$$x^l(\Lambda^{(\sigma_i)}(x)S^{(\sigma_{i+1})}(x) \pmod{x^{L_\Lambda}})) + \Lambda^{(\sigma_i)}(X_{i+1}^{-1})Y_{i+1}X_{i+1}\sum_{j=L_\Lambda+l}^{2t-2} X_{i+1}^{j-l} x^j$$

$$[x^l \overline{\Theta}^{(\sigma_i)}](x) = \quad (18)$$

$$x^l(B^{(\sigma_i)}(x)S^{(\sigma_{i+1})}(x) \pmod{x^{L_B}})) + B^{(\sigma_i)}(X_{i+1}^{-1})Y_{i+1}X_{i+1}\sum_{j=L_B+l}^{2t-2} X_{i+1}^{j-l} x^j$$

where $L_\Lambda$ and $L_B$ denote the length of $\Lambda^{(\sigma_i)}(x)$ and $B^{(\sigma_i)}(x)$, respectively.

It is observed that enforcing the criteria $\hat{\Omega}^{(\sigma_{i+1})}(X_{i+1}^{-1})=0$ and $\hat{\Theta}^{(\sigma_{i+1})}(X_{i+1}^{-1})=0$ is primarily of concern and it is therefore not necessary to keep track of $\hat{\Omega}^{(\sigma_i)}(x)$ and $\hat{\Theta}^{(\sigma_i)}(x)$. This can be effectively achieved by the following equations.

$$\overline{\Omega}(X_{i+1}^{-1}) = \quad (19)$$

$$\sum_{j=0}^{L_\Lambda-1} S_j^{(\sigma_{i+1})} X_{i+1}^{-j} \cdot \sum_{l=0}^{L_\Lambda-1-j} \Lambda_l^{(\sigma_i)} X_{i+1}^{-l} + \delta_{(L_\Lambda-1)} Y_{i+1} X_{i+1} \Lambda^{(\sigma_i)}(X_{i+1}^{-1}),$$

$$\overline{\Theta}(X_{i+1}^{-1}) = \quad (20)$$

$$\sum_{j=0}^{L_B-1} S_j^{(\sigma_{i+1})} X_{i+1}^{-j} \cdot \sum_{l=0}^{L_B-1-j} B_l^{(\sigma_i)} X_{i+1}^{-l} + \delta_{(L_B-1)} Y_{i+1} X_{i+1} B^{(\sigma_i)}(X_{i+1}^{-1}),$$

where $\delta_l$ 1 if l is odd or 0 otherwise. Note that the second summation in equation 19 can be obtained intermediately during the evaluation of $\Lambda^{(\sigma_i)}(X_{i+1}^{-1})$, and that $$[x^l \overline{\Omega}^{(\sigma_i)}](X_{i+1}^{-1}) = X_{i+1}^{-l}(\overline{\Omega}^{(\sigma_i)}(X_{i+1}^{-1}) + \delta_l Y_{i+1} X_{i+1} \Lambda^{(\sigma_i)}(X_{i+1}^{-1})) \quad (21)$$

$$[x^l \overline{\Theta}^{(\sigma_i)}](X_{i+1}^{-1}) = X_{i+1}^{-l}(\overline{\Theta}^{(\sigma_i)}(X_{i+1}^{-1}) + \delta_l Y_{i+1} B^{(\sigma_i)}(X_{i+1}^{-1})) \quad (22)$$

The above equation is valid for $\hat{\Omega}^{(\sigma_i)}$ (but not $\hat{\Theta}^{(\sigma_i)}$) with some modifications. For the last iteration, the evaluation of $\hat{\Theta}^{(\sigma_i)}$ is not necessary.

Figure 3:
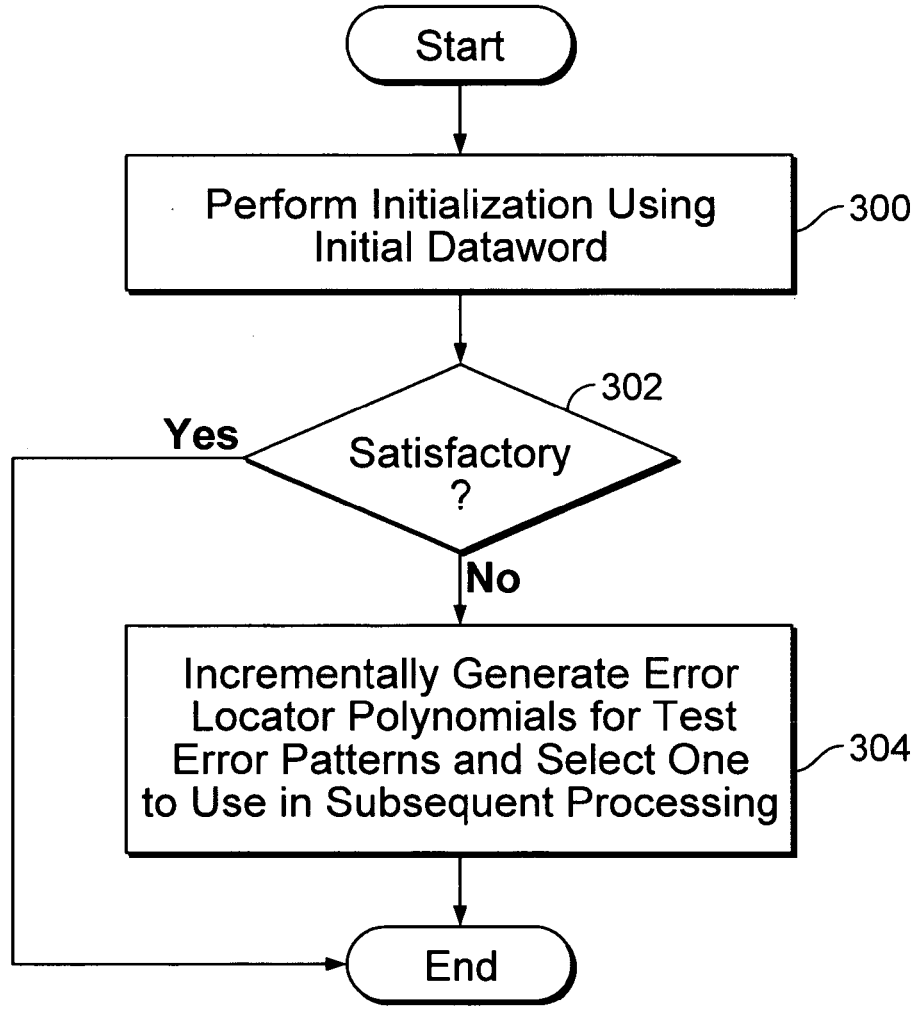
FIG. 3 is a flowchart illustrating an embodiment of a process for incrementally generating error locator polynomials.

FIG. 3 is a flowchart illustrating an embodiment of a process for incrementally generating error locator polynomials. In the example shown, the process is an alternative to a straightforward Chase decoder and circumvents repeatedly performing a Berlekamp-Massey process to obtain error locator polynomials for each test error pattern when flipping bit patterns. At 300, initialization is performed using an initial dataword. In some embodiments, the initial dataword is obtained from a soft output Viterbi decoder and a full Berlekamp-Massey process is performed. It is decided at 302 whether the results are satisfactory. For example, an error locator polynomial generated at 300 may be satisfactory and thus it is not necessary to generate other error locator polynomials. At 304, error locator polynomials are incrementally generated for test error patterns and one is selected for use in subsequent processing. In some embodiments, all possible test error patterns are processed. In some embodiments, the process terminates when at least one of the error locator polynomials generated at 304 satisfies certain criteria.

Figure 4:
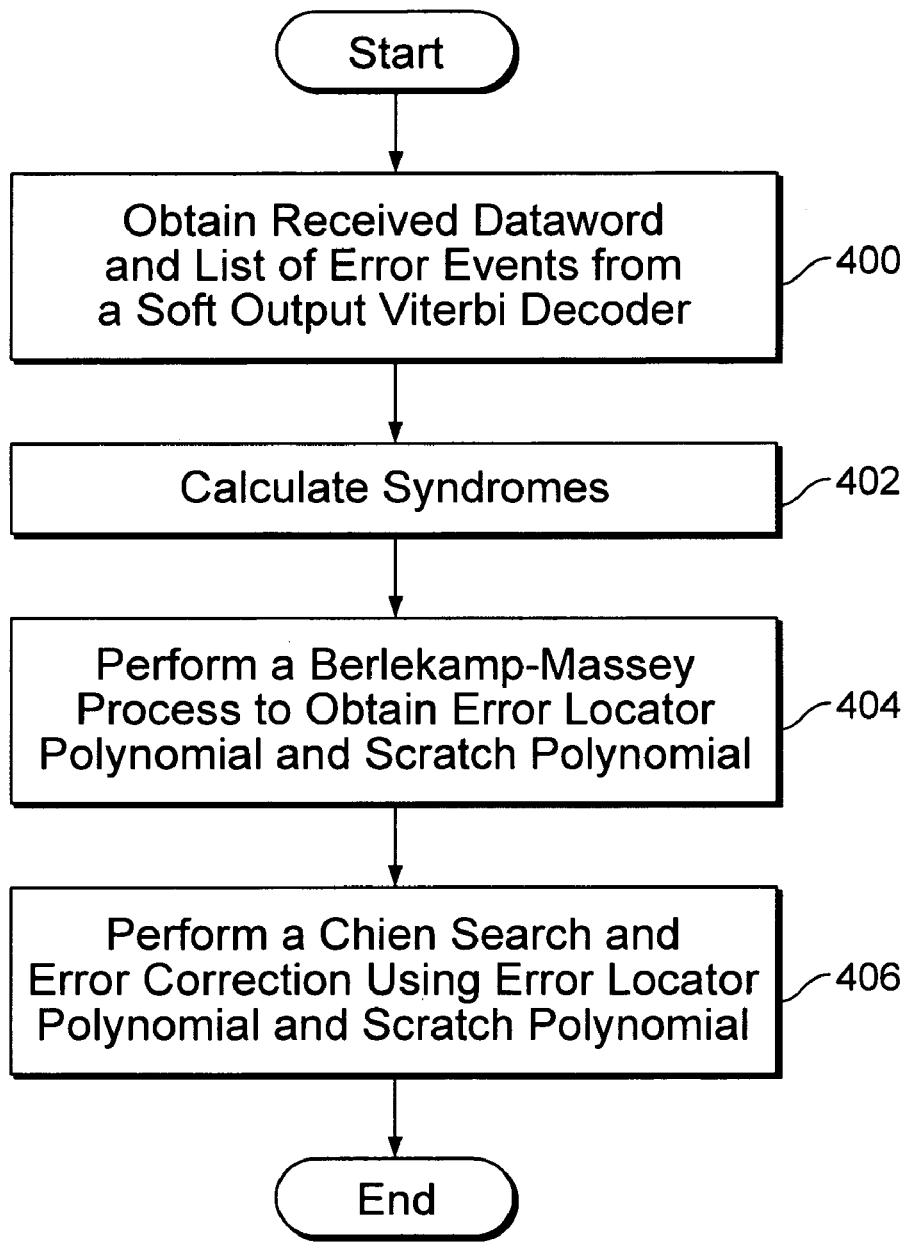
FIG. 4 is a flowchart illustrating an embodiment of a process for initialization associated with incrementally generating error locator polynomials.

FIG. 4 is a flowchart illustrating an embodiment of a process for initialization associated with incrementally generating error locator polynomials. In the example shown, initialization at 300 can be performed using the process illustrated. Alternatively, other techniques may be used.

At 400, a received dataword and a list of error events are obtained from a soft output Viterbi decoder. For example, the inputs $r=[r_{n-1}, r_{n-2}, \ldots, r_1, r_0]$ and $(X_1, Y_1), (X_2, Y_2), \ldots, (X_\tau, Y_\tau)$ are obtained.

At 402, syndromes are calculated. For example, the equation $$S_j = \sum_{j=0}^{n-1} r_j \alpha^{j(i+1)}, \; j = 0, 1, 2, \ldots, 2t-1$$

is used.

A Berlekamp-Massey process is performed to obtain an error locator polynomial, $\Lambda(x)$, and a scratch polynomial, $B(x)$, at 404. Some implementations of the Berlekamp-Massey process require 2t cycles. Incrementally generating error locator polynomials for each test error pattern circumvents repetition of the Berlekamp-Massey process and reduces the amount of time it takes to generate error locator polynomials for all combinations of flipped test error patterns. In some embodiments, additional or alternative polynomials are generated, such as the scratch polynomial, $B(x)$.

At 406, a Chien search and error correction is performed using the error locator polynomial, $\Lambda(x)$, and the scratch polynomial, $B(x)$. If the Chien search and error correction are successful then processing may conclude without incrementally generating error locator polynomials for flipped test error patterns. For example, if the data is read back almost perfectly from a storage medium and there is little or no error in the received data then the error correction performed by the initialization process is sufficient.

In some embodiments, data associated with the initialization process is stored. Referring to the example of FIG. 2, the error locator polynomial, scratch polynomial, and syndromes are saved and associated with initial dataword 200. This saved data is then used to initialize processing for branches 202, 204, and/or 206.)

$$\Lambda^{(\sigma_0)}(x) \leftarrow \Lambda(x), B^{(\sigma_0)}(x) \leftarrow B(x), S^{(\sigma_0)}(x) \leftarrow S(x)$$

Figure 5:
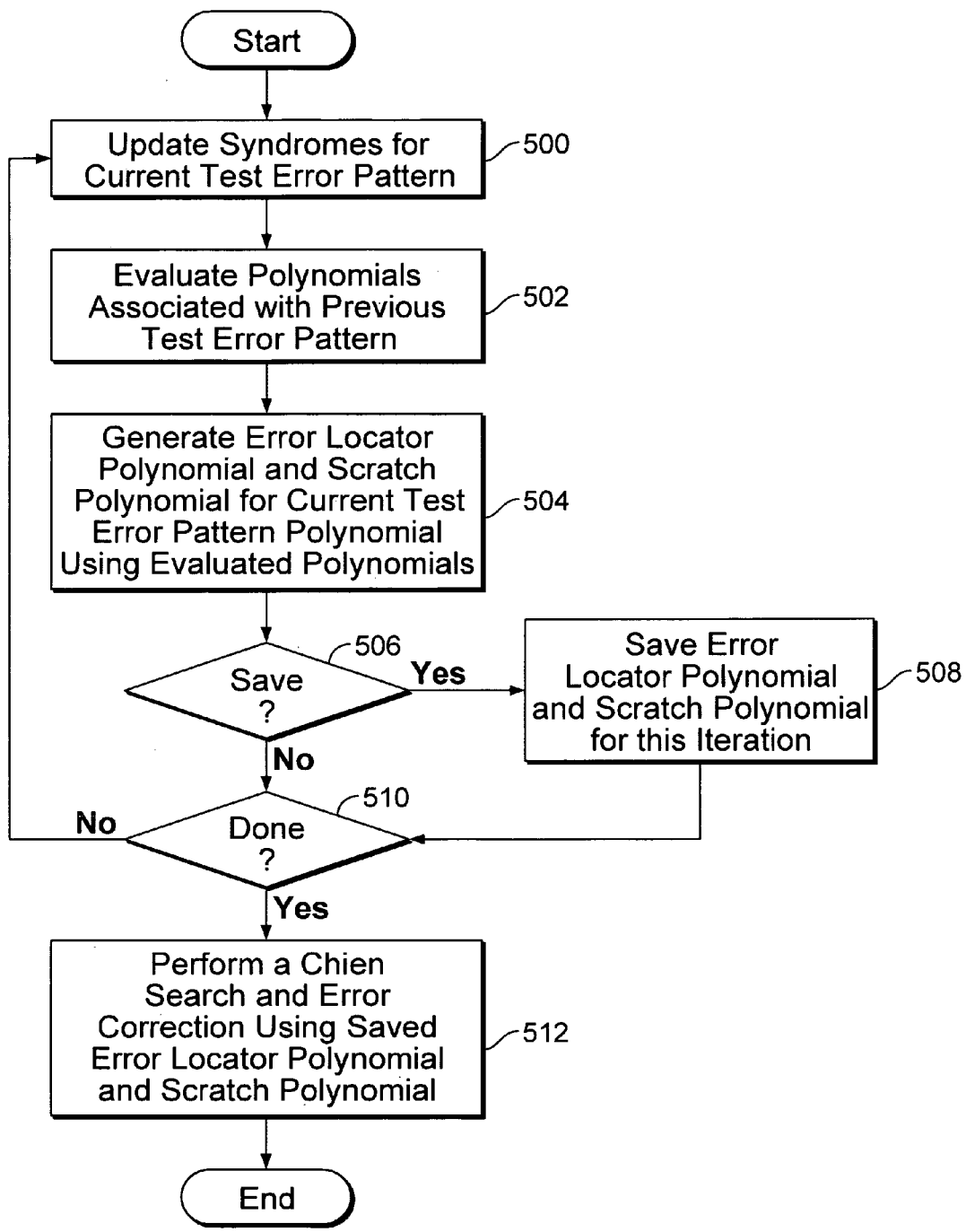
FIG. 5 is a flowchart illustrating an embodiment of a process for performing error correction using polynomials selected from an incrementally generated group.

FIG. 5 is a flowchart illustrating an embodiment of a process for performing error correction using polynomials selected from an incrementally generated group. In the example shown, the process can be used to incrementally generate polynomials at 304. Referring to the example of FIG. 2, the process can be used to traverse branches 202, 204, and 206.

At 500, syndromes for a current test error pattern are updated. In some embodiments, the following equation is used:

$$S_j^{(\sigma_{i+1})} \leftarrow S_j^{(\sigma_i)} + Y_{i+1} X_{i+1}^{j+1}, j=0,1,2,\ldots,t+\tau-1.$$

If it is the beginning of a branch in a tree structure, saved syndromes associated with initial test pattern 200 is used. If the process is in the middle of a given branch, syndromes from the immediately prior test error pattern are used.

In some embodiments, not all syndromes are updated since the syndromes $S_{t+\tau}^{(\sigma_i)}, S_{t+\tau+1}^{(\sigma_i)}, \ldots, S_{2t-1}^{(\sigma_i)}$ are not used in the iterations.

Polynomials associated with previous test error pattern are evaluated at 502. In some embodiments, the following polynomials are evaluated:

$$\Lambda^{(\sigma_i)}(X_{i+1}^{-1}), B^{(\sigma_i)}(X_{i+1}^{-1}), \overline{\Omega}^{(\sigma_i)}(X_{i+1}^{-1}), \overline{\Theta}^{(\sigma_i)}(X_{i+1}^{-1})$$

An error locator polynomial and a scratch polynomial are generated for the current test error pattern using the evaluated polynomials. In some embodiments, case statements are used to determine an appropriate LSFR to use and the case statements cover all possible cases. In some embodiments, the following case statements and associated LSFR are used. In the embodiment shown, a given polynomial for the current test error pattern is based on the immediately prior version of that polynomial.

Case 1: $\Lambda^{(\sigma_i)}(X_{i+1}^{-1}) = 0 \wedge \overline{\Omega}^{(\sigma_i)}(X_{i+1}^{-1}) = 0$ (23)

$$\begin{cases} \Lambda^{(\sigma_{i+1})}(x) \leftarrow \Lambda^{(\sigma_i)}(x) \\ B^{(\sigma_{i+1})}(x) \leftarrow (1 - X_{i+1}^2 x^2) B^{(\sigma_i)}(x) \\ L_\Lambda \leftarrow L_\Lambda \ L_B \leftarrow L_B + 2 \end{cases}$$

Case 2: $B^{(\sigma_i)}(X_{i+1}^{-1}) = 0 \wedge \overline{\Theta}^{(\sigma_i)}(X_{i+1}^{-1}) = 0$ (24)

$$\begin{cases} \Lambda^{(\sigma_{i+1})}(x) \leftarrow (1 - X_{i+1}^2 x^2) \Lambda^{(\sigma_i)}(x) \\ B^{(\sigma_{i+1})}(x) \leftarrow B^{(\sigma_i)}(x) \\ L_\Lambda \leftarrow L_\Lambda + 2 \ L_B \leftarrow L_B \end{cases}$$

Case 3: $L_\Lambda < L_B \wedge \Lambda^{(\sigma_i)}(X_{i+1}^{-1}) \neq 0$ (25)

$$\begin{cases} \Lambda^{(\sigma_{i+1})}(x) \leftarrow (1 - X_{i+1}^2 x^2) \Lambda^{(\sigma_i)}(x) \\ B^{(\sigma_{i+1})}(x) \leftarrow B^{(\sigma_i)}(x) + ax\Lambda^{(\sigma_i)}(x) + bx^2 \Lambda^{(\sigma_i)}(x) \\ L_\Lambda \leftarrow L_\Lambda + 2 \ L_B \leftarrow L_B \end{cases}$$

where a and b are suitable values to enforce $B^{(\sigma_i)}(X_{i+1}^{-1})=0$ and $\hat{\Theta}^{(\sigma_{i+1})}(X_{i+1}^{-1})=0$, such that $$\begin{cases} B^{(\sigma_i)}(X_{i+1}^{-1}) + a[x\Lambda^{(\sigma_i)}](X_{i+1}^{-1}) + b[x^2 \Lambda^{(\sigma_i)}](X_{i+1}^{-1}) = 0 \\ \overline{\Theta}^{(\sigma_i)}(X_{i+1}^{-1}) + a[x\overline{\Omega}^{(\sigma_i)}](X_{i+1}^{-1}) + b[x^2 \overline{\Omega}^{(\sigma_i)}](X_{i+1}^{-1}) = 0 \end{cases}$$

Case 4: $L_\Lambda > L_B \wedge B^{(\sigma_i)}(X_{i+1}^{-1}) \neq 0$ $$\begin{cases} \Lambda^{(\sigma_{i+1})}(x) \leftarrow \Lambda^{(\sigma_i)}(x) + axB^{(\sigma_i)}(x) + bx^2 B^{(\sigma_i)}(x) \\ B^{(\sigma_{i+1})}(x) \leftarrow (1 - X_{i+1}^2 x^2) B^{(\sigma_i)}(x) \\ L_\Lambda \leftarrow L_\Lambda \ L_B \leftarrow L_B + 2 \end{cases}$$ (26)

where a and b are suitable values to enforce $\Lambda^{(\sigma_{i+1})}(X_{i+1}^{-1})=0$ and $\hat{\Omega}^{(\sigma_{i+1})}(X_{i+1}^{-1})=0$, such that $$\begin{cases} \Lambda^{(\sigma_i)}(X_{i+1}^{-1}) + a[xB^{(\sigma_i)}](X_{i+1}^{-1}) + b[x^2 B^{(\sigma_i)}](X_{i+1}^{-1}) = 0 \\ \overline{\Omega}^{(\sigma_i)}(X_{i+1}^{-1}) + a[x\overline{\Theta}^{(\sigma_i)}](X_{i+1}^{-1}) + b[x^2 \overline{\Theta}^{(\sigma_i)}](X_{i+1}^{-1}) = 0 \end{cases}$$

Case 5: $L_\Lambda < L_B \wedge \Lambda^{(\sigma_i)}(X_{i+1}^{-1}) = 0 \wedge \overline{\Omega}^{(\sigma_i)}(X_{i+1}^{-1}) \neq 0$ $$\begin{cases} \Lambda^{(\sigma_{i+1})}(x) \leftarrow (1 - X_{i+1}x) \Lambda^{(\sigma_i)}(x) \\ B^{(\sigma_{i+1})}(x) \leftarrow B^{(\sigma_i)}(x) + ax\Lambda^{(\sigma_i)}(x) + bxB^{(\sigma_i)}(x) \\ L_\Lambda \leftarrow L_\Lambda + 1 \ L_B \leftarrow L_B + 1 \end{cases}$$ (27)

where a and b are suitable values to enforce $B^{(\sigma_{i+1})}(X_{i+1}^{-1})=0$ and $\hat{\Theta}^{(\sigma_{i+1})}(X_{i+1}^{-1})=0$, such that $$\begin{cases} B^{(\sigma_i)}(X_{i+1}^{-1}) + a[x\Lambda^{(\sigma_i)}](X_{i+1}^{-1}) + b[xB^{(\sigma_i)}](X_{i+1}^{-1}) = 0 \\ \overline{\Theta}^{(\sigma_i)}(X_{i+1}^{-1}) + a[x\overline{\Omega}^{(\sigma_i)}](X_{i+1}^{-1}) + b[x\overline{\Theta}^{(\sigma_i)}](X_{i+1}^{-1}) = 0 \end{cases}$$

Case 6: $L_\Lambda < L_B \wedge B^{(\sigma_i)}(X_{i+1}^{-1}) = 0 \wedge \overline{\Theta}^{(\sigma_i)}(X_{i+1}^{-1}) \neq 0$ $$\begin{cases} \Lambda^{(\sigma_{i+1})}(x) \leftarrow \Lambda^{(\sigma_i)}(x) + axB^{(\sigma_i)}(x) + bx\Lambda^{(\sigma_i)}(x) \\ B^{(\sigma_{i+1})}(x) \leftarrow (1 - X_{i+1}x) B^{(\sigma_i)}(x) \\ L_\Lambda \leftarrow L_\Lambda + 1 \ L_B \leftarrow L_B + 1 \end{cases}$$ (28)

where a and b are suitable values to enforce $\Lambda^{(\sigma_{i+1})}(X_{i+1}^{-1})=0$ and $\hat{\Omega}^{(\sigma_{i+1})}(X_{i+1}^{-1})=0$, such that $$\begin{cases} \Lambda^{(\sigma_i)}(X_{i+1}^{-1}) + a[xB^{(\sigma_i)}](X_{i+1}^{-1}) + b[x\Lambda^{(\sigma_i)}](X_{i+1}^{-1}) = 0 \\ \overline{\Omega}^{(\sigma_i)}(X_{i+1}^{-1}) + a[x\overline{\Theta}^{(\sigma_i)}](X_{i+1}^{-1}) + b[x\overline{\Omega}^{(\sigma_i)}](X_{i+1}^{-1}) = 0 \end{cases}$$

Case 7: $L_\Lambda = L_B \wedge B^{(\sigma_i)}(X_{i+1}^{-1}) \overline{\Omega}^{(\sigma_i)}(X_{i+1}^{-1}) \neq \Lambda^{(\sigma_i)}(X_{i+1}^{-1}) \overline{\Theta}^{(\sigma_i)}(X_{i+1}^{-1})$ $$\begin{cases} \Lambda^{(\sigma_{i+1})}(x) \leftarrow \Lambda^{(\sigma_i)}(x) + axB^{(\sigma_i)}(x) + bx\Lambda^{(\sigma_i)}(x) \\ B^{(\sigma_{i+1})}(x) \leftarrow B^{(\sigma_i)}(x) + a'x\Lambda^{(\sigma_i)}(x) + b'xB^{(\sigma_i)}(x) \\ L_\Lambda \leftarrow L_\Lambda + 1 \ L_B \leftarrow L_B + 1 \end{cases}$$ (29)

where a and b are suitable values to enforce $\Lambda^{(\sigma_{i+1})}(X_{i+1}^{-1})=0$ and $\hat{\Omega}^{(\sigma_{i+1})}(X_{i+1}^{-1})=0$, such that $$\begin{cases} \Lambda^{(\sigma_i)}(X_{i+1}^{-1}) + a[xB^{(\sigma_i)}](X_{i+1}^{-1}) + b[x\Lambda^{(\sigma_i)}](X_{i+1}^{-1}) = 0 \\ \overline{\Omega}^{(\sigma_i)}(X_{i+1}^{-1}) + a[x\overline{\Theta}^{(\sigma_i)}](X_{i+1}^{-1}) + b[x\overline{\Omega}^{(\sigma_i)}](X_{i+1}^{-1}) = 0 \end{cases}$$

and a' and b' are suitable values to enforce $B^{(\sigma_{i+1})}(X_{i+1}^{-1})=0$ and $\hat{\Theta}^{(\sigma_{i+1})}(X_{i+1}^{-1})=0$, such that $$\begin{cases} B^{(\sigma_i)}(X_{i+1}^{-1}) + a'[x\Lambda^{(\sigma_i)}](X_{i+1}^{-1}) + b'[xB^{(\sigma_i)}](X_{i+1}^{-1}) = 0 \\ \overline{\Theta}^{(\sigma_i)}(X_{i+1}^{-1}) + a'[x\overline{\Omega}^{(\sigma_i)}](X_{i+1}^{-1}) + b'[x\overline{\Theta}^{(\sigma_i)}](X_{i+1}^{-1}) = 0 \end{cases}$$

Case 8: $L_\Lambda = L_B \wedge \Lambda^{(\sigma_i)}(X_{i+1}^{-1}) \neq 0 \wedge B^{(\sigma_i)}(X_{i+1}^{-1})\overline{\Omega}^{(\sigma_i)}(X_{i+1}^{-1})$ $= \Lambda^{(\sigma_i)}(X_{i+1}^{-1})\overline{\Theta}^{(\sigma_i)}(X_{i+1}^{-1})$ $$\begin{cases} \Lambda^{(\sigma_{i+1})}(x) \leftarrow (1 - X_{i+1}^2 x^2)\Lambda^{(\sigma_i)}(x) \\ B^{(\sigma_{i+1})}(x) \leftarrow \Lambda^{(\sigma_i)}(X_{i+1}^{-1}) \cdot B^{(\sigma_i)}(x) + B^{(\sigma_i)}(X_{i+1}^{-1}) \cdot \Lambda^{(\sigma_i)}(x) \\ L_\Lambda \leftarrow L_\Lambda + 2 \quad L_B \leftarrow L_B \end{cases} \quad (30)$$

At 506, it is determined whether to save data. For example, the error locator and scratch polynomial generated at 504 are compared to saved polynomials. A metric, such as a minimum distance, can be used in a comparison. In some embodiments, if this is the first iteration (e.g., test pattern 208) then the polynomials generated at 504 are compared to polynomials generating during an initialization process (e.g., associated with initial test pattern 200). If it is decided to save, at 508 the error locator polynomial and scratch polynomial for this iteration are saved. The previously saved polynomials are discarded.

After saving at 508 or if the decision at 506 is to not save, at 510 it is decided whether generation of polynomials is done. In some embodiments, generation concludes when all possible flipped test patterns are processed. For example, when all of branches 1-3 (202-206, respectively) are processed generation concludes. In some embodiments, it is not necessary to process all possible test patterns. For example, the saved polynomials may be the minimal distance and further processing to generate additional polynomials is not necessary. If generation of polynomials is not done, at 500 the syndromes are updated. Otherwise, at 512 a Chien search and error correction is performed using the saved error locator polynomial and scratch polynomial.

In some embodiments, a particular case dominates the rest of the cases. In one example, case 7 occurs more frequently compared to the rest of the cases. In some embodiments, an implementation is optimized or otherwise improved to take advantage of a particular case that occurs more frequently. The particular optimization or improvement can depend upon the statistical distribution associated with the case statements, the particular implementation of a decoder, etc.

In some embodiments, polynomials are incrementally generated in a parallel manner. Two or more test patterns may be processed simultaneously to further reduce the amount of time to generate polynomials for multiple test error patterns. Trade-offs associated with processing speed, size/cost, and/or design complexity of a decoder with parallel processing are evaluated to select an appropriate number of test error patterns to process in parallel.

In various embodiments different techniques are used in addition to or as an alternative to the example described. In some embodiments, case statements are not used. In some embodiments, different linear feedback shift registers and/or different associated conditions are used to incrementally generate polynomials. In some embodiments, a different set of polynomials are compared, generated, and/or saved. For example, in some embodiments less than four polynomials are evaluated at 502.

The following lemmas discuss properties associated with the above embodiment for initialization and incremental generation of error locator polynomials.

Lemma 4 After completion of the example process, the following occurs at the end of the i-th iteration $$L_\Lambda + L_B = 2(t+i). \quad (31)$$

Lemma 5 The example process precisely generates the solution for the proposed optimization problem.

Proof: The proof is by induction. Assume that $\Lambda^{(\sigma_i)}(x)$ and $B^{(\sigma_i)}(x)$ optimize the proposed problem $A[\sigma_i]$ and $B[\sigma_i]$, respectively, for the error pattern set $\sigma_i$.

In Case 1, $\Lambda^{(\sigma_i)}(x)$ suffices to accommodate criteria (i), (ii) and (iii) of $A[\sigma_i]$ and thus it is the optimal solution. As for B, incorporating $\Lambda$ is not useful in achieving criteria (ii) and (iii) of $B[\sigma_i]$. It can be verified that the described LFSR satisfies criteria (ii) and (iii) for $B[\sigma_i]$ while minimizing the degree (recall that $\Lambda^{(\sigma_i)}(x)$ and $B^{(\sigma_i)}(x)$ both cannot divide $(1-X_{i+1}x)$ as discussed in Lemma 1). Case 2 is analogous to Case 1.

In Case 3, it is noted that $L_{xB} > L_{L\Lambda} + 2$. Therefore, incorporating $xB^{(\sigma_i)}(x)$ into $\Lambda^{(\sigma_{i+1})}(x)$ would lead to a degree of at least $L_\Lambda + 3$. Thus, the given form of $\Lambda^{(\sigma_{i+1})}(x)$ is the optimal solution. On the other hand, the given form of $B^{(\sigma_{i+1})}(x)$ does not increase the degree while satisfying all three constraints. Case 4 is analogous to Case 3.

In Case 5, the given form of $\Lambda^{(\sigma_{i+1})}(x)$ (which has a lower degree than the one given in Case 3) satisfies all three constraints while securing the minimum degree. On the other hand, the form of $B^{(\sigma_{i+1})}(x)$ given in Case 3 is unable to meet all three constraints. Thus the given form achieves the minimum degree while meeting all three constraints. Case 6 follows the same arguments as Case 5.

In Case 7, it is impossible to meet the three constraints without increasing the degree of $\Lambda(x)$ or $B(x)$ while the given form increases the degree by one and satisfies all constraints.

In Case 8, the given form of $B^{(\sigma_{i+1})}(x)$ meets all three constraints without increasing the degree. However, even increasing the degree $L_\Lambda$ by 1 will not satisfy the three constraints, thus the proposed form minimizes the degree. Note that $\Lambda^{(\sigma_{i+1})}(x)$ cannot take the form of $B^{(\sigma_{i+1})}(x)$ as constraint (i) of $A[\sigma_i]$ is not satisfied.

Cases 2, 3 and 5 cover the branch $L_\Lambda < L_B$; Cases 1, 4 and 6 cover the branch $L_\Lambda > L_B$: Cases 1, 7 and 8 cover the branch $L_\Lambda = L_B$. Thus, the above 8 cases cover all possibilities (recall that B and $\Lambda$ must not share a same root to be interpolated as discussed in Lemma 1 (iii)). Occasionally, some of the cases are overlapping but the solution is congruent when an overlapping condition occurs.

Lemmas 3 and 5 assert that incremental generation of polynomials is a "one-pass" (when implemented in parallel) alternative to straightforward Chase decoding. Consider a given sequential flipping of error patterns $(X_1, Y_1)$, $(X_2, Y_2)$, ..., $(X_\tau, Y_\tau)$ for a received word r. If after flipping the pattern set $\sigma_i$, the modified word is within distance t (where t is the error-correction capability) from a codeword, then $\Lambda^{(\sigma_i)}(x)$ obtained by the described incremental generation process is exactly the error locator polynomial associated with this codeword.

In some embodiments, with an error locator polynomial obtained, Forney's formula is used to determine the corresponding error magnitudes. From a computational point of view, there is a complexity of O(nt) to determine all error locations for a given error locator polynomial. In some embodiments, this is circumvented by translating operations to vector operations, where the vectors $\Lambda$, B, $\hat{\Omega}$, and $\hat{\Theta}$ are the evaluation vectors of the corresponding polynomials at points $\alpha^i$, i=0, 1, 2, ..., n−1. If vector operations are used, all four polynomials are tracked rather than just Λ and B as described in the example of FIG. 5. The example of FIG. 5 is appropriately modified. Multiplication of a polynomial with x is translated to component-wise multiplication of an evaluation vector with the vector $[\alpha^0, \alpha^1, \alpha^2, \ldots, \alpha^{n-1}]$. Every vector operation has a complexity of O(n) instead of a complexity O(t) associated with the example of FIG. 5. The complexity of one iteration is reduced from a complexity of O(nt) to O(n).

Thus, one iteration of the incremental generation technique (not using vector operations) has a computational complexity of O(t). In some embodiments, this is performed in "one-pass" using parallel operations. By vectorizing the polynomials Λ, B, $\bar{\Omega}$, and $\bar{\Theta}$ at points $\alpha^i$, i=0, 1, 2, ..., n−1, the complete iteration (including polynomial updating and error locating) has a complexity of O(n). In some embodiments, this is performed in "one-pass" using parallel operations.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for generating a polynomial, including:
   obtaining, at a processor, a first error locator polynomial, associated with locating errors in encoded data;
   incrementally generating a second error locator polynomial using the processor, including by:
      obtaining a test error pattern; and
      flipping those bits in the first error locator polynomial that correspond to the test error pattern to obtain the second error locator polynomial; and
   performing error correction decoding on encoded data using the second error locator polynomial.

2. A method as recited in claim 1, wherein incrementally generating excludes performing a Berlekamp-Massey process.

3. A method as recited in claim 1, further including performing a Berlekamp-Massey process to obtain an initial error locator polynomial.

4. A method as recited in claim 1, wherein obtaining includes incrementally generating the first error locator polynomial.

5. A method as recited in claim 1, wherein the test error pattern is associated with a tree structure.

6. A method as recited in claim 1, wherein the encoded data is associated with storage.

7. A method as recited in claim 1, further including incrementally generating a second scratch polynomial, associated with the test error pattern, based at least in part on a first scratch polynomial.

8. A method as recited in claim 1, wherein incrementally generating a second error locator polynomial is further based at least in part on a first scratch polynomial.

9. A method as recited in claim 1, further including evaluating the first error locator polynomial, wherein incrementally generating takes into consideration the evaluation of the first error locator polynomial.

10. A method as recited in claim 1, wherein incrementally generating includes using a plurality of cases.

11. A method as recited in claim 1, wherein incrementally generating includes using a plurality of cases and a probability associated with one or more of the plurality of cases is considered.

12. A method as recited in claim 1, further including determining whether to overwrite a saved error locator polynomial with the second error locator polynomial.

13. A method as recited in claim 1, further including determining at least one error location using a saved error locator polynomial.

14. A system for generating a polynomial, including:
   an interface configured to obtain a first error locator polynomial, associated with locating errors in encoded data;
   a processor configured to:
      incrementally generate a second error locator polynomial, including by:
         obtaining a test error pattern; and
         flipping those bits in the first error locator polynomial that correspond to the test error pattern to obtain the second error locator polynomial; and
      perform error correction decoding on encoded data using the second error locator polynomial.

15. A system as recited in claim 14, wherein the test error pattern is associated with a tree structure.

16. A system as recited in claim 14, wherein the processor is further configured to evaluate the first error locator polynomial, and the processor is configured to incrementally generate the second error locator polynomial by taking into consideration the evaluation of the first error locator polynomial.

17. A system as recited in claim 14, wherein the processor is further configured to determine at least one error location using a saved error locator polynomial.

18. A computer program product for generating a polynomial, the computer program product being embodied in a computer readable storage medium and comprising computer instructions for:
   obtaining a first error locator polynomial, associated with locating errors in encoded data;
   incrementally generating a second error locator polynomial, including by:
      obtaining a test error pattern; and
      flipping those bits in the first error locator polynomial that correspond to the test error pattern to obtain the second error locator polynomial; and
   performing error correction decoding on encoded data using the second error locator polynomial.

19. A computer program product as recited in claim 18, wherein the test error pattern is associated with a tree structure.

20. A computer program product as recited in claim 18, the computer program product further comprising computer instructions for evaluating the first error locator polynomial, wherein incrementally generating takes into consideration the evaluation of the first error locator polynomial.

21. A computer program product as recited in claim 18, the computer program product further comprising computer instructions for determining at least one error location using a saved error locator polynomial.

22. A method as recited in claim 1, wherein incrementally generating a second error locator polynomial (Λ(x)) further includes using one or more of the following cases:

Case 1: $\Lambda^{(\sigma_i)}(X_{i+1}^{-1}) = 0 \wedge \bar{\Omega}^{(\sigma_i)}(X_{i+1}^{-1}) = 0$
$$\begin{cases} \Lambda^{(\sigma_{i+1})}(x) \leftarrow \Lambda^{(\sigma_i)}(x) \\ L_\Lambda \leftarrow L_\Lambda \end{cases};$$

Case 2: $B^{(\sigma_i)}(X_{i+1}^{-1}) = 0 \wedge \bar{\Theta}^{(\sigma_i)}(X_{i+1}^{-1}) = 0$
$$\begin{cases} \Lambda^{(\sigma_{i+1})}(x) \leftarrow (1 - X_{i+1}^2 x^2)\Lambda^{(\sigma_i)}(x) \\ L_\Lambda \leftarrow L_\Lambda + 2 \end{cases};$$

-continued

Case 3: $L_\Lambda > L_B \wedge \Lambda^{(\sigma_i)}(X_{i+1}^{-1}) \neq 0$
$$\begin{cases} \Lambda^{(\sigma_{i+1})}(x) \leftarrow (1 - X_{i+1}^2 x^2)\Lambda^{(\sigma_i)}(x) \\ L_\Lambda \leftarrow L_\Lambda + 2 \end{cases};$$

Case 4: $L_\Lambda > L_B \wedge B^{(\sigma_i)}(X_{i+1}^{-1}) \neq 0$
$$\begin{cases} \Lambda^{(\sigma_{i+1})}(x) \leftarrow \Lambda^{(\sigma_i)}(x) + axB^{(\sigma_i)}(x) + bx^2 B^{(\sigma_i)}(x) \\ L_\Lambda \leftarrow L_\Lambda \end{cases};$$

Case 5: $L_\Lambda < L_B \wedge \Lambda^{(\sigma_i)}(X_{i+1}^{-1}) = 0 \wedge \overline{\Omega}^{(\sigma_i)}(X_{i+1}^{-1}) \neq 0$
$$\begin{cases} \Lambda^{(\sigma_{i+1})}(x) \leftarrow (1 - X_{i+1} x)\Lambda^{(\sigma_i)}(x) \\ L_\Lambda \leftarrow L_\Lambda + 1 \end{cases};$$

Case 6: $L_\Lambda > L_B \wedge B^{(\sigma_i)}(X_{i+1}^{-1}) = 0 \wedge \overline{\Theta}^{(\sigma_i)}(X_{i+1}^{-1}) \neq 0$
$$\begin{cases} \Lambda^{(\sigma_{i+1})}(x) \leftarrow \Lambda^{(\sigma_i)}(x) + axB^{(\sigma_i)}(x) + bx\Lambda^{(\sigma_i)}(x) \\ L_\Lambda \leftarrow L_\Lambda + 1 \end{cases};$$

Case 7: $L_\Lambda = L_B \wedge B^{(\sigma_i)}(X_{i+1}^{-1})\overline{\Omega}^{(\sigma_i)}(X_{i+1}^{-1}) \neq \Lambda^{(\sigma_i)}(X_{i+1}^{-1})\overline{\Theta}^{(\sigma_i)}(X_{i+1}^{-1})$
$$\begin{cases} \Lambda^{(\sigma_{i+1})}(x) \leftarrow \Lambda^{(\sigma_i)}(x) + axB^{(\sigma_i)}(x) + bx\Lambda^{(\sigma_i)}(x) \\ L_\Lambda \leftarrow L_\Lambda + 1 \end{cases}; \text{ or}$$

Case 8: $L_\Lambda = L_B \wedge \Lambda^{(\sigma_i)}(X_{i+1}^{-1}) \neq 0 \wedge B^{(\sigma_i)}(X_{i+1}^{-1})\overline{\Omega}^{(\sigma_i)}(X_{i+1}^{-1}) = \Lambda^{(\sigma_i)}(X_{i+1}^{-1})\overline{\Theta}^{(\sigma_i)}(X_{i+1}^{-1})$
$$\begin{cases} \Lambda^{(\sigma_{i+1})}(x) \leftarrow (1 - X_{i+1}^2 x^2)\Lambda^{(\sigma_i)}(x) \\ L_\Lambda \leftarrow L_\Lambda + 2 \end{cases}.$$

23. A system as recited in claim 14, wherein the processor is configured to incrementally generate a second error locator polynomial ($\Lambda(x)$) by further using one or more of the following cases:

Case 1: $\Lambda^{(\sigma_i)}(X_{i+1}^{-1}) = 0 \wedge \overline{\Omega}^{(\sigma_i)}(X_{i+1}^{-1}) = 0$
$$\begin{cases} \Lambda^{(\sigma_{i+1})}(x) \leftarrow \Lambda^{(\sigma_i)}(x) \\ L_\Lambda \leftarrow L_\Lambda \end{cases};$$

Case 2: $B^{(\sigma_i)}(X_{i+1}^{-1}) = 0 \wedge \overline{\Theta}^{(\sigma_i)}(X_{i+1}^{-1}) = 0$
$$\begin{cases} \Lambda^{(\sigma_{i+1})}(x) \leftarrow (1 - X_{i+1}^2 x^2)\Lambda^{(\sigma_i)}(x) \\ L_\Lambda \leftarrow L_\Lambda + 2 \end{cases};$$

Case 3: $L_\Lambda > L_B \wedge \Lambda^{(\sigma_i)}(X_{i+1}^{-1}) \neq 0$
$$\begin{cases} \Lambda^{(\sigma_{i+1})}(x) \leftarrow (1 - X_{i+1}^2 x^2)\Lambda^{(\sigma_i)}(x) \\ L_\Lambda \leftarrow L_\Lambda + 2 \end{cases};$$

Case 4: $L_\Lambda > L_B \wedge B^{(\sigma_i)}(X_{i+1}^{-1}) \neq 0$
$$\begin{cases} \Lambda^{(\sigma_{i+1})}(x) \leftarrow \Lambda^{(\sigma_i)}(x) + axB^{(\sigma_i)}(x) + bx^2 B^{(\sigma_i)}(x) \\ L_\Lambda \leftarrow L_\Lambda \end{cases};$$

Case 5: $L_\Lambda < L_B \wedge \Lambda^{(\sigma_i)}(X_{i+1}^{-1}) = 0 \wedge \overline{\Omega}^{(\sigma_i)}(X_{i+1}^{-1}) \neq 0$
$$\begin{cases} \Lambda^{(\sigma_{i+1})}(x) \leftarrow (1 - X_{i+1} x)\Lambda^{(\sigma_i)}(x) \\ L_\Lambda \leftarrow L_\Lambda + 1 \end{cases};$$

Case 6: $L_\Lambda > L_B \wedge B^{(\sigma_i)}(X_{i+1}^{-1}) = 0 \wedge \overline{\Theta}^{(\sigma_i)}(X_{i+1}^{-1}) \neq 0$
$$\begin{cases} \Lambda^{(\sigma_{i+1})}(x) \leftarrow \Lambda^{(\sigma_i)}(x) + axB^{(\sigma_i)}(x) + bx\Lambda^{(\sigma_i)}(x) \\ L_\Lambda \leftarrow L_\Lambda + 1 \end{cases};$$

Case 7: $L_\Lambda = L_B \wedge B^{(\sigma_i)}(X_{i+1}^{-1})\overline{\Omega}^{(\sigma_i)}(X_{i+1}^{-1}) \neq \Lambda^{(\sigma_i)}(X_{i+1}^{-1})\overline{\Theta}^{(\sigma_i)}(X_{i+1}^{-1})$
$$\begin{cases} \Lambda^{(\sigma_{i+1})}(x) \leftarrow \Lambda^{(\sigma_i)}(x) + axB^{(\sigma_i)}(x) + bx\Lambda^{(\sigma_i)}(x) \\ L_\Lambda \leftarrow L_\Lambda + 1 \end{cases}; \text{ or}$$

Case 8: $L_\Lambda = L_B \wedge \Lambda^{(\sigma_i)}(X_{i+1}^{-1}) \neq 0 \wedge B^{(\sigma_i)}(X_{i+1}^{-1})\overline{\Omega}^{(\sigma_i)}(X_{i+1}^{-1}) = \Lambda^{(\sigma_i)}(X_{i+1}^{-1})\overline{\Theta}^{(\sigma_i)}(X_{i+1}^{-1})$
$$\begin{cases} \Lambda^{(\sigma_{i+1})}(x) \leftarrow (1 - X_{i+1}^2 x^2)\Lambda^{(\sigma_i)}(x) \\ L_\Lambda \leftarrow L_\Lambda + 2 \end{cases}.$$

24. A computer program product as recited in claim 18, wherein the computer instructions for incrementally generating a second error locator polynomial ($\Lambda(x)$) further include computer instructions for using one or more of the following cases:

Case 1: $\Lambda^{(\sigma_i)}(X_{i+1}^{-1}) = 0 \wedge \overline{\Omega}^{(\sigma_i)}(X_{i+1}^{-1}) = 0$
$$\begin{cases} \Lambda^{(\sigma_{i+1})}(x) \leftarrow \Lambda^{(\sigma_i)}(x) \\ L_\Lambda \leftarrow L_\Lambda \end{cases};$$

Case 2: $B^{(\sigma_i)}(X_{i+1}^{-1}) = 0 \wedge \overline{\Theta}^{(\sigma_i)}(X_{i+1}^{-1}) = 0$
$$\begin{cases} \Lambda^{(\sigma_{i+1})}(x) \leftarrow (1 - X_{i+1}^2 x^2)\Lambda^{(\sigma_i)}(x) \\ L_\Lambda \leftarrow L_\Lambda + 2 \end{cases};$$

Case 3: $L_\Lambda > L_B \wedge \Lambda^{(\sigma_i)}(X_{i+1}^{-1}) \neq 0$
$$\begin{cases} \Lambda^{(\sigma_{i+1})}(x) \leftarrow (1 - X_{i+1}^2 x^2)\Lambda^{(\sigma_i)}(x) \\ L_\Lambda \leftarrow L_\Lambda + 2 \end{cases};$$

Case 4: $L_\Lambda > L_B \wedge B^{(\sigma_i)}(X_{i+1}^{-1}) \neq 0$
$$\begin{cases} \Lambda^{(\sigma_{i+1})}(x) \leftarrow \Lambda^{(\sigma_i)}(x) + axB^{(\sigma_i)}(x) + bx^2 B^{(\sigma_i)}(x) \\ L_\Lambda \leftarrow L_\Lambda \end{cases};$$

Case 5: $L_\Lambda < L_B \wedge \Lambda^{(\sigma_i)}(X_{i+1}^{-1}) = 0 \wedge \overline{\Omega}^{(\sigma_i)}(X_{i+1}^{-1}) \neq 0$
$$\begin{cases} \Lambda^{(\sigma_{i+1})}(x) \leftarrow (1 - X_{i+1} x)\Lambda^{(\sigma_i)}(x) \\ L_\Lambda \leftarrow L_\Lambda + 1 \end{cases};$$

Case 6: $L_\Lambda > L_B \wedge B^{(\sigma_i)}(X_{i+1}^{-1}) = 0 \wedge \overline{\Theta}^{(\sigma_i)}(X_{i+1}^{-1}) \neq 0$
$$\begin{cases} \Lambda^{(\sigma_{i+1})}(x) \leftarrow \Lambda^{(\sigma_i)}(x) + axB^{(\sigma_i)}(x) + bx\Lambda^{(\sigma_i)}(x) \\ L_\Lambda \leftarrow L_\Lambda + 1 \end{cases};$$

Case 7: $L_\Lambda = L_B \wedge B^{(\sigma_i)}(X_{i+1}^{-1})\overline{\Omega}^{(\sigma_i)}(X_{i+1}^{-1}) \neq \Lambda^{(\sigma_i)}(X_{i+1}^{-1})\overline{\Theta}^{(\sigma_i)}(X_{i+1}^{-1})$
$$\begin{cases} \Lambda^{(\sigma_{i+1})}(x) \leftarrow \Lambda^{(\sigma_i)}(x) + axB^{(\sigma_i)}(x) + bx\Lambda^{(\sigma_i)}(x) \\ L_\Lambda \leftarrow L_\Lambda + 1 \end{cases}; \text{ or}$$

Case 8: $L_\Lambda = L_B \wedge \Lambda^{(\sigma_i)}(X_{i+1}^{-1}) \neq 0 \wedge B^{(\sigma_i)}(X_{i+1}^{-1})\overline{\Omega}^{(\sigma_i)}(X_{i+1}^{-1}) = \Lambda^{(\sigma_i)}(X_{i+1}^{-1})\overline{\Theta}^{(\sigma_i)}(X_{i+1}^{-1})$
$$\begin{cases} \Lambda^{(\sigma_{i+1})}(x) \leftarrow (1 - X_{i+1}^2 x^2)\Lambda^{(\sigma_i)}(x) \\ L_\Lambda \leftarrow L_\Lambda + 2 \end{cases}.$$

\* \* \* \* \*

UNITED STATES PATENT AND TRADEMARK OFFICE
CERTIFICATE OF CORRECTION

PATENT NO. : 7,793,195 B1  Page 1 of 2
APPLICATION NO. : 11/433645
DATED : September 7, 2010
INVENTOR(S) : Yingquan Wu It is certified that error appears in the above-identified patent and that said Letters Patent is hereby corrected as shown below:

Claim 22

Column 17, line 2 delete

"Case 3: $L_\Lambda > L_B \wedge \Lambda^{(\sigma_i)}(X_{i+1}^{-1}) \neq 0$ $$\begin{cases} \Lambda^{(\sigma_{i+1})}(x) \leftarrow (1 - X_{i+1}^2 x^2)\Lambda^{(\sigma_i)}(x) \\ \quad L_\Lambda \leftarrow L_\Lambda + 2 \end{cases} \; ;"\text{ and insert}$$

-- Case 3: $L_\Lambda < L_B \wedge \Lambda^{(\sigma_i)}(X_{i+1}^{-1}) \neq 0$ $$\begin{cases} \Lambda^{(\sigma_{i+1})}(x) \leftarrow (1 - X_{i+1}^2 x^2)\Lambda^{(\sigma_i)}(x) \\ \quad L_\Lambda \leftarrow L_\Lambda + 2 \end{cases} \; ; --$$

Claim 23

Column 17, line 49 delete

"Case 3: $L_\Lambda > L_B \wedge \Lambda^{(\sigma_i)}(X_{i+1}^{-1}) \neq 0$ $$\begin{cases} \Lambda^{(\sigma_{i+1})}(x) \leftarrow (1 - X_{i+1}^2 x^2)\Lambda^{(\sigma_i)}(x) \\ \quad L_\Lambda \leftarrow L_\Lambda + 2 \end{cases} \; ;"\text{ and insert}$$

-- Case 3: $L_\Lambda < L_B \wedge \Lambda^{(\sigma_i)}(X_{i+1}^{-1}) \neq 0$ $$\begin{cases} \Lambda^{(\sigma_{i+1})}(x) \leftarrow (1 - X_{i+1}^2 x^2)\Lambda^{(\sigma_i)}(x) \\ \quad L_\Lambda \leftarrow L_\Lambda + 2 \end{cases} \; ; --$$

Signed and Sealed this

Second Day of November, 2010

David J. Kappos
*Director of the United States Patent and Trademark Office*

CERTIFICATE OF CORRECTION (continued)
U.S. Pat. No. 7,793,195 B1

Claim 24

Column 18, line 34 delete

"Case 3: $\quad L_\Lambda > L_B \wedge \Lambda^{(\sigma_i)}(X_{i+1}^{-1}) \neq 0$ $$\begin{cases} \Lambda^{(\sigma_{i+1})}(x) \leftarrow (1 - X_{i+1}^2 x^2)\Lambda^{(\sigma_i)}(x) \\ \qquad L_\Lambda \leftarrow L_\Lambda + 2 \end{cases} \quad ;\text{ -- and insert}$$

-- Case 3: $\quad L_\Lambda < L_B \wedge \Lambda^{(\sigma_i)}(X_{i+1}^{-1}) \neq 0$ $$\begin{cases} \Lambda^{(\sigma_{i+1})}(x) \leftarrow (1 - X_{i+1}^2 x^2)\Lambda^{(\sigma_i)}(x) \\ \qquad L_\Lambda \leftarrow L_\Lambda + 2 \end{cases} \quad ;\text{ --}$$